United States Patent
Coulot et al.

(10) Patent No.: US 11,158,752 B2
(45) Date of Patent: Oct. 26, 2021

(54) OPTOMECHANICAL SYSTEM FOR CAPTURING AND TRANSMITTING INCIDENT LIGHT WITH A VARIABLE DIRECTION OF INCIDENCE TO AT LEAST ONE COLLECTING ELEMENT AND CORRESPONDING METHOD

(71) Applicant: Insolight SA, Lausanne (CH)

(72) Inventors: Laurent Coulot, Lausanne (CH); Mathieu Ackermann, Lausanne (CH); Florian Gerlich, Lausanne (CH)

( * ) Notice: Subject to any disclaimer, the term of this patent is extended or adjusted under 35 U.S.C. 154(b) by 0 days.

(21) Appl. No.: 16/300,643

(22) PCT Filed: May 12, 2017

(86) PCT No.: PCT/EP2017/061469
§ 371 (c)(1),
(2) Date: Nov. 12, 2018

(87) PCT Pub. No.: WO2017/194741
PCT Pub. Date: Nov. 16, 2017

(65) Prior Publication Data
US 2019/0288144 A1 Sep. 19, 2019

(30) Foreign Application Priority Data
May 12, 2016 (CH) .................... 00619/16

(51) Int. Cl.
*H01L 31/044* (2014.01)
*H01L 31/054* (2014.01)
(Continued)

(52) U.S. Cl.
CPC .......... *H01L 31/0543* (2014.12); *F24S 23/30* (2018.05); *F24S 23/31* (2018.05);
(Continued)

(58) Field of Classification Search
CPC ....... H01L 31/00–078; Y02E 10/50–60; H02S 40/20–22; H02S 20/30–32
(Continued)

(56) References Cited

U.S. PATENT DOCUMENTS 4,456,783 A * 6/1984 Baker ..................... F24S 23/30
136/246
6,127,620 A * 10/2000 Tange ................. H01L 31/0543
136/246
(Continued)

FOREIGN PATENT DOCUMENTS

WO    2015047928    4/2015

OTHER PUBLICATIONS

PCT Search Report and Written Opinion dated Jun. 21, 2017 for corresponding PCT Application No. PCT/EP2017/061469 filed May 12, 2017, pp. 1-6.

*Primary Examiner* — Bach T Dinh
(74) *Attorney, Agent, or Firm* — Pearne & Gordon LLP

(57) ABSTRACT

Disclosed is an optomechanical system (10) for capturing and transmitting incident light (40) with a variable direction of incidence to at least one collecting element (31, 31', 31", 31'", 31A, 31B), with
an optical arrangement (20) able to capture a beam of the incident light (40), concentrate the captured beam of the incident light, and transmit one or more concentrated beams (50) of the incident light to the at least one collecting element (31, 31', 31", 31'", 31A, 31B), and
a shifting mechanism for moving the optical arrangement (20) with respect to the at least one collecting element (31, 31', 31", 31'", 31A, 31B), wherein the moving of the shifting mechanism is controllable in such a way that, for any direction of incidence of the incident light (40), the one or more concentrated beams (50) of the
(Continued)

incident light can be optimally collected by the at least one collecting element (31, 31', 31", 31'", 31A, 31B),
In this optomechanical system (10), the optical arrangement (20) comprises a first optical layer made of optical lenses having an aspheric curvature, and at least one surface of the lenses has a polynomial curvature with multiple orders.

Furthermore, the present invention also relates to a corresponding method for capturing and transmitting incident light with a variable direction of incidence to at least one collecting element.

25 Claims, 12 Drawing Sheets

(51) Int. Cl.
  *H02S 20/32* (2014.01)
  *G02B 19/00* (2006.01)
  *F24S 23/30* (2018.01)
  *F24S 50/20* (2018.01)
  *F24S 30/20* (2018.01)

(52) U.S. Cl.
  CPC .......... *F24S 50/20* (2018.05); *G02B 19/0014* (2013.01); *G02B 19/0042* (2013.01); *H01L 31/0549* (2014.12); *H02S 20/32* (2014.12); *F24S 30/20* (2018.05); *Y02E 10/47* (2013.01); *Y02E 10/52* (2013.01)

(58) Field of Classification Search
  USPC .................................................. 136/243–265
  See application file for complete search history.

(56) References Cited

U.S. PATENT DOCUMENTS

| | | | |
|---|---|---|---|
| 9,029,681 B1* | 5/2015 | Nielson | F24S 30/455 |
| | | | 136/246 |
| 9,130,092 B1* | 9/2015 | Nielson | H01L 31/022441 |
| 2009/0250094 A1* | 10/2009 | Robison | F24S 30/20 |
| | | | 136/246 |
| 2010/0032005 A1* | 2/2010 | Ford | H01L 31/0543 |
| | | | 136/246 |
| 2010/0278480 A1* | 11/2010 | Vasylyev | G02B 3/005 |
| | | | 385/33 |
| 2010/0307565 A1* | 12/2010 | Suga | H01L 31/0547 |
| | | | 136/246 |
| 2012/0012741 A1* | 1/2012 | Vasylyev | G02B 5/0231 |
| | | | 250/237 R |
| 2014/0090692 A1* | 4/2014 | Okamoto | H01L 31/048 |
| | | | 136/246 |
| 2014/0261622 A1* | 9/2014 | Floyd | H01L 31/0547 |
| | | | 136/246 |
| 2015/0063751 A1* | 3/2015 | Tremblay | H01L 31/0543 |
| | | | 385/33 |

* cited by examiner

OPTOMECHANICAL SYSTEM FOR CAPTURING AND TRANSMITTING INCIDENT LIGHT WITH A VARIABLE DIRECTION OF INCIDENCE TO AT LEAST ONE COLLECTING ELEMENT AND CORRESPONDING METHOD

TECHNICAL FIELD OF THE INVENTION

The present invention relates to the technical field of optical systems, more specifically the technical field of optomechanical systems. In particular, the present invention relates to an optomechanical system for capturing and transmitting incident light with a variable direction of incidence to at least one collecting element and the corresponding method. Such an optomechanical system can in particular be used in an advantageous way in construction of solar panels for production of solar electricity.

BACKGROUND OF THE INVENTION

Photovoltaic (or PV) cells have been widely used to convert the energy of the sunlight into electrical power, due to the rising demand for energy from renewable sources boosted by the problems linked to greenhouse gas emissions and fossil fuels reserves depletion. This dominant solar power technology consists of individual mono- or polycrystalline silicon photovoltaic cells, assembled in flat panel modules and covering an area irradiated by sunlight. Although this technology is mature and proven in mass production, its efficiency is generally limited to 16 to 22% for single junction silicon solar cells.

One of the technical challenges when using CPV systems consists in tracking the sunlight, as its direction of incidence varies over time. Therefore, the major drawback of the CPV systems is that they need to be constantly oriented towards the light source (i.e. the sun), in order to be able to concentrate efficiently the incident sunlight. This constraint is caused by the physical principle of étendue, which limits the maximum concentration factor for a given angular acceptance. The movement of the sun over the day and over the seasons results in large variations of azimuthal and elevation angles. A conventional concentrator with a fixed orientation requires therefore wide acceptance angles to cover these variations, and will therefore only achieve relatively small concentration factors (typically less than 10).

SUMMARY OF THE INVENTION

Thus, present invention provides a new optomechanical system and a corresponding method for capturing and transmitting incident light with a variable direction of incidence to at least one collecting element, in which the above-described drawbacks of the known systems and methods are completely overcome or at least greatly diminished.

The optomechanical system and the corresponding method for capturing and transmitting incident light with a variable direction of incidence to at least one collecting element increases the efficiency of collecting light without sacrificing ease and versatility of installation. Moreover, the overall costs of the system should not be prohibitive.

In particular, the invention provides an optomechanical system for capturing and transmitting incident light with a variable direction of incidence to at least one collecting element, with an optical arrangement able to capture a beam of the incident light, concentrate the captured beam of the incident light, and transmit one or more concentrated beams of the incident light to the at least one collecting element, and a shifting mechanism for moving the optical arrangement with respect to the at least one collecting element, wherein the moving of the shifting mechanism is controllable in such a way that, for any direction of incidence of the incident light, the one or more concentrated beams of the incident light can be optimally collected by the at least one collecting element, wherein the optical arrangement comprises a first optical layer made of optical lenses having an aspheric curvature, at least one surface of the lenses having a polynomial curvature with multiple orders.

Thanks to the present invention, it is possible to achieve a higher efficiency of collection of incident light with respect to previously proposed solutions. Given that, thanks to the controlled moving of the shifting mechanism, the one or more concentrated beams of the incident light can be optimally collected by the at least one collecting element, independently of the direction of incidence of the incident light, and the overall collection and harvesting of the incident light can be maximized. When the optomechanical system of the invention is used with sunlight and solar cells, the present invention allows for a significant reduction in active solar cell material because the overall surface area of the solar cells can be significantly reduced with respect to systems which do not comprise the described concentration mechanism. Therefore, high efficiency solar cells can be used, increasing the efficiency of the system without resulting in prohibitive costs. In addition, the optical arrangement comprises a first optical layer made of optical lenses having an aspheric curvature, at least one surface of the lenses having a polynomial curvature with multiple orders. These different shapes of the lenses can increase the flexibility of the optomechanical system according to the present invention for use in various installations. In more specific terms, the use of properly designed aspheric lenses allows for wider angular acceptance (up to 60°) and for an almost flat Petzval curve (quasi-telecentricity).

The aspherical curvature of the first optical layer of the optical arrangement can in particular be chosen such that the field curvature of the optical arrangement is minimized. Also, the aspherical curvature of the first optical layer of the optical arrangement can be chosen such that a spherical field curvature is achieved. These features allow for an optimisation of the optomechanical system of the invention and in particular to minimise or simplify the displacements of the system, maximising the performance at the same time.

In another embodiment of the present invention, the optical arrangement further comprises a second optical layer, the first optical layer and the second optical layer being movable one with respect to the other. Using two different optical layers allows for a higher flexibility and an increased precision in adapting the optomechanical system to the varying direction of incidence of the incident light, increasing thereby the efficiency of collection of the incident light by the collecting elements.

The diameter of the lenses in the second optical layer can preferably be equal or smaller than the diameter of the lenses in the first optical layer. In that way, the precision of the concentration of the incident light can be increased, allowing for a better collection and concentration of light leaving the first optical layer.

Preferably, the lenses are made of glass, polymethyl methacrylate (PMMA), silicone (possibly bonded on glass) or polycarbonate (PC). Glass is the most common lens material. It has a good mechanical strength and is not easy to scratch. Also, it transmits well almost all wavelengths. PMMA, also called acrylic glass, silicone and PC have similar optical properties but they are much lighter than glass and can be easily and accurately shaped by cheap industrial processes such as injection-moulding or embossing.

In another embodiment of the present invention, each of the one or more concentrated beams of the incident light is collected by one collecting element located at the focus of the corresponding lens of the optical arrangement. Therefore, incident light can be collected by an array of collecting elements corresponding to the array of lenses in the optical arrangement.

In addition, the at least one collecting element can comprise a first additional optical element for improving the angular acceptance and/or improving the homogeneity of distribution of the corresponding concentrated beam of the incident light and/or increasing the concentration factor and/or improving the telecentricity. This first additional optical element can in particular be an aspheric lens, a parabolic concentrator, a Köhler optic or a combination of these elements.

Furthermore, the optomechanical system can also comprise at least one second additional optical element for splitting the at least one concentrated beam of the incident light into beams of light with different wavelengths, wherein each of the individual beams of light with different wavelengths is collected by a separate collecting element. Thanks to this splitting, dedicated collecting elements can be used to collect independently each beam of light with its specific range of wavelengths, improving the overall energy conversion efficiency.

In another embodiment of the present invention, the optomechanical system further comprises a waveguide for receiving the one or more concentrated beams of incident light and guiding the one or more concentrated beams of incident light to the at least one collecting element. Thanks to the use of a waveguide, the optomechanical system can be constructed in a more flexible way. In particular, the at least one collecting element can then advantageously be located on the side and/or below the waveguide, depending on the specific requirements on the installation site.

Furthermore, the optomechanical system can further comprise at least one collecting element for collecting diffuse light or light incoming with extreme incidence angles. This "secondary" collecting element can in particular be located below the "primary" collecting element in the direction of propagation of the light and, in that way, collect all light which has not been collected by the "primary" collecting elements. This "secondary" collecting element can also be placed around the "primary" collecting element. This additional feature allows for an even higher efficiency of the system.

Use of the optomechanical system according to the present invention is particularly suited to situations where the incident light is sunlight and the at least one collecting element is a solar cell. Then, solar panels with a significantly higher efficiency can be produced, which do not require cumbersome external trackers with rotating elements.

In another embodiment of the present invention, the shifting mechanism is able to move the optical arrangement with respect to the at least one collecting element along one, two or three perpendicular axes. Specifically, the movement of the shifting mechanism can preferably be based on the mechanical deformation in order to avoid friction and thus increase the reliability and the lifespan of the optomechanical systems. To this end, elastic springs and/or blades (leaf springs) are suitable elements.

All embodiments of the present invention mentioned above have the advantage not to require any external tracking system. This allows for the realisation of flat concentrator solar panel modules.

At this place, we would like to reiterate that the present invention also relates to a method for capturing and transmitting incident light with a variable direction of incidence to at least one collecting element, comprising capturing a beam of the incident light by an optical arrangement, concentrating the captured beam of the incident light, and transmitting one or more concentrated beams of the incident light to the at least one collecting element, and moving the optical arrangement with respect to the at least one collecting element by a shifting mechanism, wherein the moving of the shifting mechanism is controllable in such a way that, for any direction of incidence of the incident light, the one or more concentrated beams of the incident light can be optimally collected by the at least one collecting element, wherein the optical arrangement comprises a first optical layer made of optical lenses having an aspheric curvature, at least one surface of the lenses having a polynomial curvature with multiple orders.

BRIEF DESCRIPTION OF THE DRAWINGS

The foregoing and other objects, features and advantages of the present invention are apparent from the following detailed description taken in combination with the accompanying drawings in which.

DETAILED DESCRIPTION

Figure 1A:
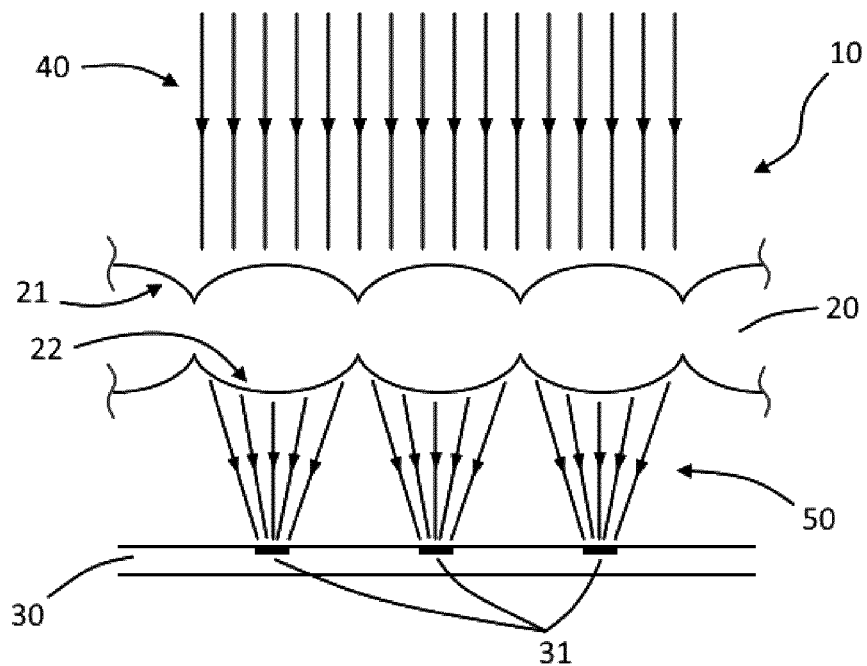
FIG. 1A is a schematic cross-sectional view of an optomechanical system with the incident light having a first direction; according to a first embodiment of the present invention the lenses have aspherical curvatures.
Figure 1B:
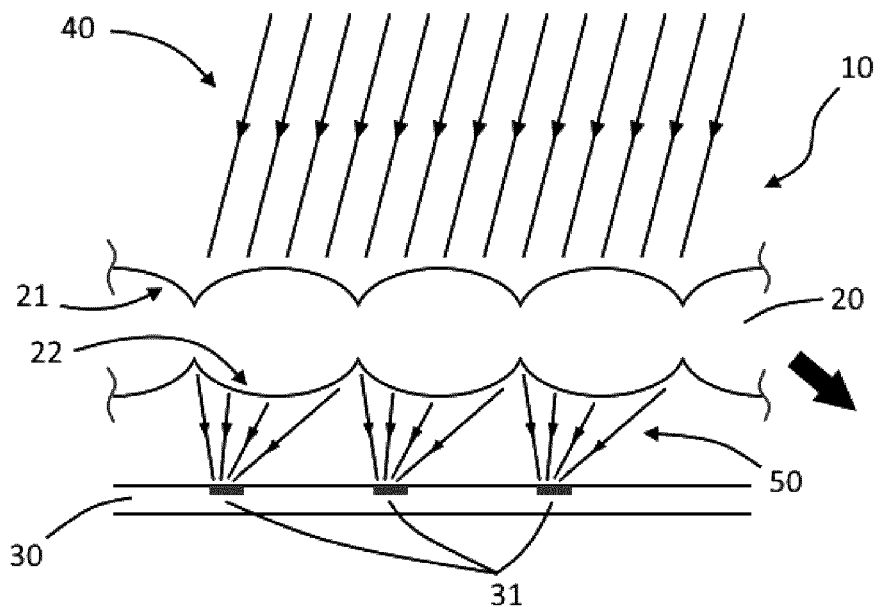
FIG. 1B is a schematic cross-sectional view of an optomechanical system with the incident light having a second direction; according to a first embodiment of the present invention the lenses have aspherical curvatures.
Figure 2:
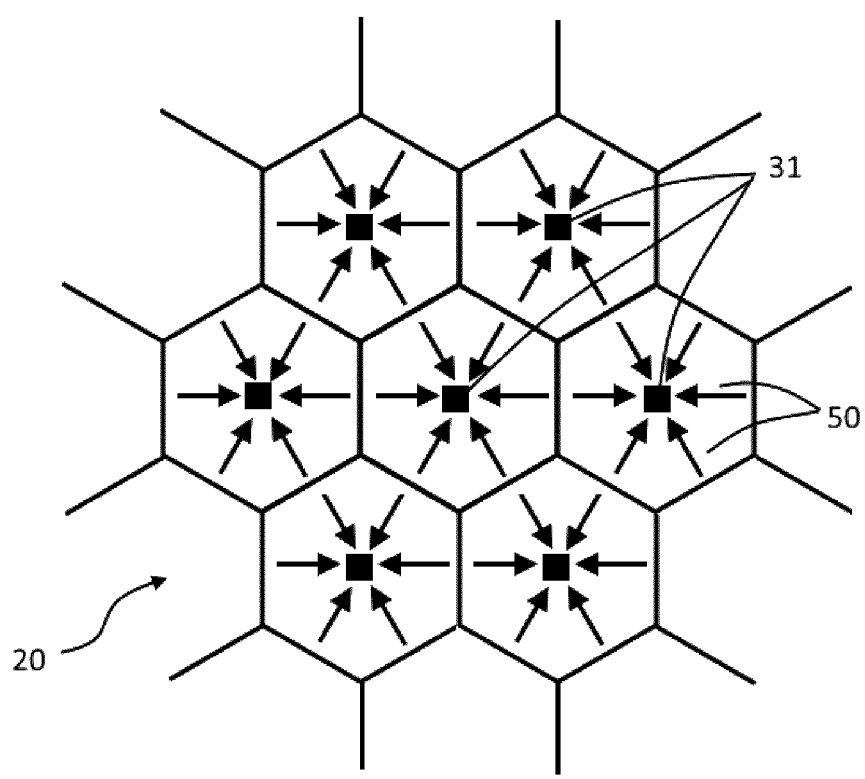
FIG. 2 is a schematic view from above through the optomechanical system according to the first embodiment of the present invention.

FIGS. 1A, 1B and 2 illustrate an optomechanical system 10 according to a first embodiment of the present invention. This optomechanical system 10 comprises an optical arrangement 20 which, in this embodiment, comprises a single optical layer composed of a series of optical lenses having aspherical curvatures. The convex surfaces of the lenses are illustrated by reference numerals 21 and 22. The optomechanical system 10 according to this first embodiment of the present invention can capture and collect incident light 40. To this end, the optical arrangement 20 is able to capture the beam of the incident light 40 impacting the upper surface of the array of lenses, to concentrate the captured beam of the incident light, and to transmit one or more concentrated beams 50 of the incident light to the collecting elements 31.

In this application, the term "to concentrate" a beam of light basically means that the beam is decollimated and focused in a particular point. In particular, the optomechanical system according to the present invention can be used to concentrate incident sunlight 40 (in which all sunrays have a parallel direction of incidence) and make that all sunrays focus one or more particular points in which they can then be collected by one or more solar cells 31.

Coming back to the FIGS. 1A and 1B, it can be seen that the optical arrangement 20 concentrates the beam of incident light 40 into three different concentrated beams 50. Thereafter, each of these concentrated beams 50 is collected by a corresponding collecting element 31. Of course, in a real-world implementation, namely in the solar panels, the number of lenses in the optical arrangement 20 will generally be much higher than three and there will also be a corresponding number of collecting elements (solar cells) 31.

Once the direction of incidence of the incident light 40 has changed, e.g. when the sun has changed its position on the sky during the day, the optical arrangement 20 of FIG. 1A will not be able to concentrate the incident light 40 efficiently to the collecting elements 31. In order to maintain the optimal concentration on the collecting elements 31 and thus also the efficiency of collection of the incident light 40, the optical arrangement 20 can be moved with respect to the collecting elements 31 by means of a shifting mechanism (not represented), as illustrated by the arrow. After this movement, the optical arrangement 20 is again positioned such that the incident light 40 can be concentrated and collected by the collecting elements 31 in the optimal way. This movement of the optical arrangement 20 can be carried out constantly during the movement of the direction of incidence of the incident light 40, thereby keeping the concentration and collection of the incident light 40 at an optimal level for any direction of incidence.

FIG. 2 illustrates the optomechanical system 10 in a view from above. The optical arrangement 20, consisting of lenses which have a hexagonal shape and build a honeycomb pattern, concentrates the incident light such that each concentrated beam 50 can be collected by a collecting element 31 assigned to the particular lens. The collecting elements 31 can be joined together in a collecting arrangement 30, comprising in particular also connecting elements (not represented) for interconnecting all collecting elements 31.

Lenses schematized in FIGS. 1A and 1B in the optical arrangement 20 have aspheric curvatures. More specifically, at least one surface of the lenses (e.g. the top surface, the bottom surface or both the top and bottom surface) can also have a polynomial curvature with multiple orders (typically 6 orders or more), which allows for changes of curvature signs along the surface (inflexion points). This allows making a focal point with reduced optical aberrations over wide angles, while giving more degree of freedom to the optical design. Furthermore, lenses can also have a circular, a square or a hexagonal contour (as illustrated in FIG. 2). A typical lens diameter is from 5 mm to 50 mm and their thickness from 3 mm to 25 mm. They have a typical concentration factor from 50 to 500 times.

Figure 3A:
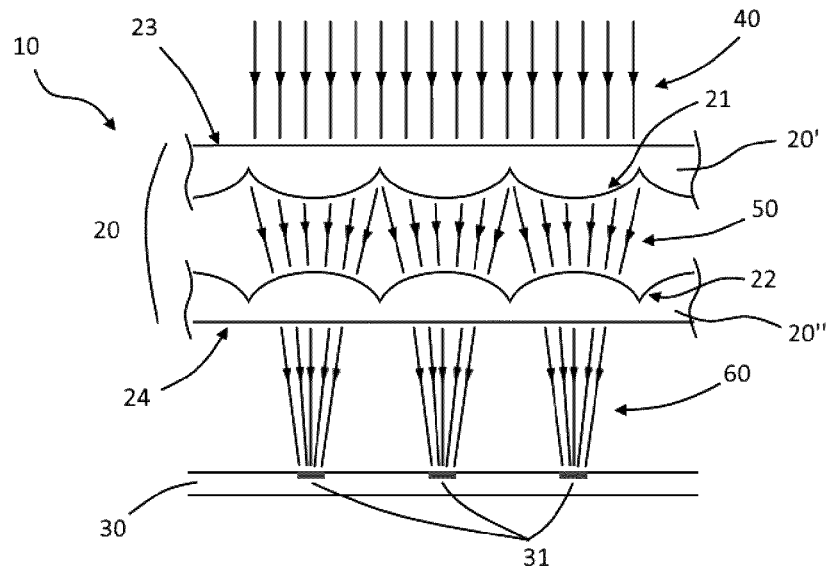
FIG. 3A is a schematic cross-sectional view of an optomechanical system with the incident light having a first direction; according to a second embodiment of the present invention, the second and first optical layers are made of lenses with aspherical curvatures.
Figure 3B:
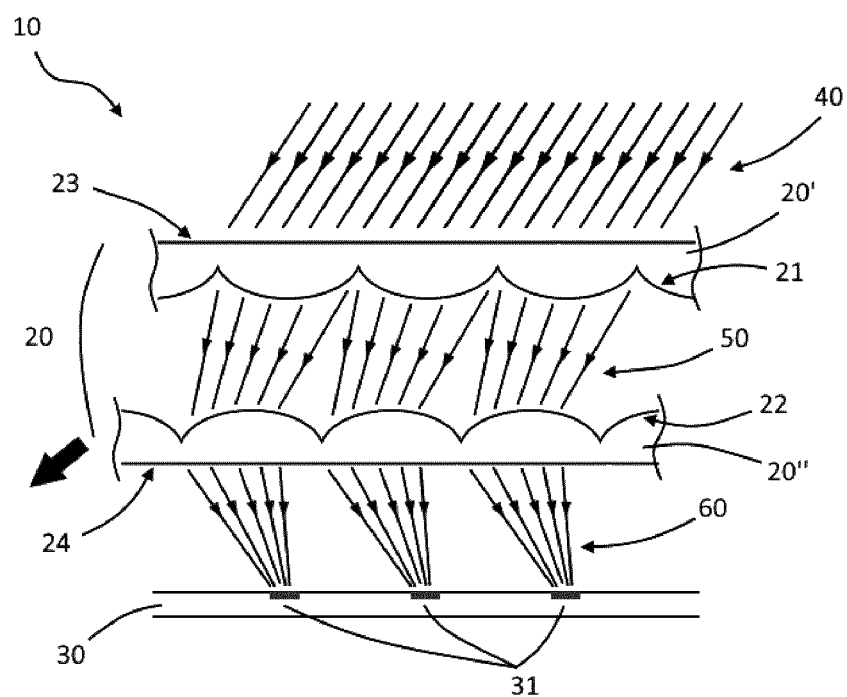
FIG. 3B is a schematic cross-sectional view of an optomechanical system with the incident light having a second direction; according to a second embodiment of the present invention, the second and first optical layers are made of lenses with aspherical curvatures.

FIGS. 3A and 3B illustrate an optomechanical system 10 according to a second embodiment of the present invention. With respect to the optomechanical system 10 according to the first embodiment of the invention, this optomechanical system 10 according to the second embodiment of the invention comprises an optical arrangement 20 which is composed of two optical layers 20', 20". These two optical layers 20', 20" are also composed of lenses with aspherical curvatures.

When a beam of incident light 40 impacts the upper surface 23 of the optical arrangement 20, the optical arrangement 20 is again able to capture the beam of the incident light 40, to concentrate this captured beam of the incident light (through an intermediate beam 50) and to transmit the fully concentrated beams 60 of the incident light to the collecting elements 31.

Again, once the direction of incidence of the incident light 40 has changed, the optical arrangement 20 of FIG. 3A cannot concentrate the incident light 40 efficiently to the collecting elements 31. Therefore, and in order to maintain the optimal concentration of the incident light 40 on the collecting elements 31, the optical arrangement 20 can be moved with respect to the collecting elements 31 by means of a shifting mechanism, as illustrated by the arrow in FIG. 3B. After this movement, the optical arrangement 20 is again positioned such that the incident light 40 can be concentrated and collected by the collecting elements 31 in the optimal way.

The movement of the optical arrangement 20 can be carried out by moving both optical layers 20' and 20" with respect to the collecting elements 31, or by moving only one of the two optical layers 20', 20" with respect to each other and/or with respect to the collecting elements 31.

Figure 4:
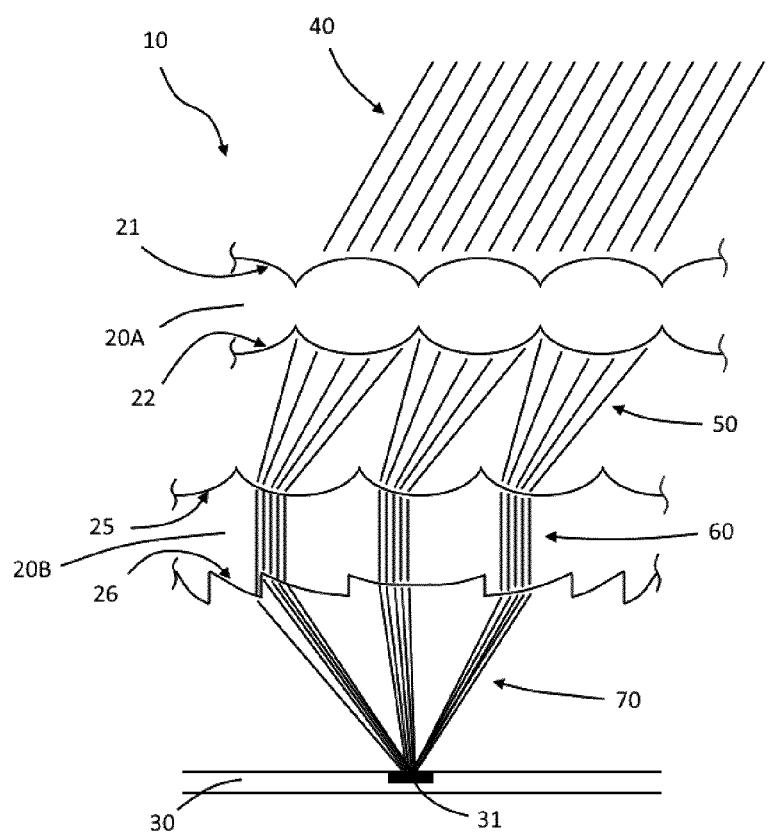
FIG. 4 is a schematic cross-sectional view of an optomechanical system; according to a third embodiment of the present invention the first optical layer is made of lenses with aspherical curvatures.

FIG. 4 illustrates the optomechanical system 10 according to a third embodiment of the present invention. In this embodiment, the optical arrangement 20 again consists of two optical layers 20A, 20B. However, the first optical layer 20A is composed of aspherical lenses and the second optical layer 20B (further down in the direction of incidence of the incident light 40) is a single layer with surfaces 25, 26 having shapes allowing for an optimal concentration of the incident light 40. As can be seen in FIG. 4, the beam of the incident light 40 is first slightly concentrated to beams 50 and then collimated to parallel beams 60 inside the second optical layer 20B, before being concentrated to various beams 70 which are all collected by a single collecting element 31. It goes without saying that this embodiment allows for a further cost reduction by using even less collecting elements 31 than in the previous embodiments (i.e. higher concentration factor).

Figure 5:
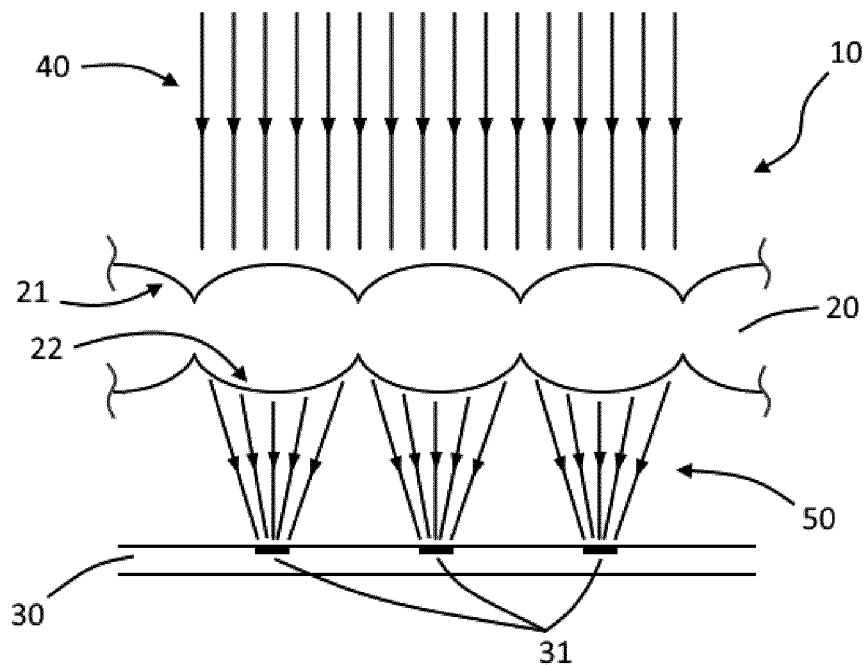
FIG. 5 is another schematic cross-sectional view of the optomechanical system; according to the first embodiment of the present invention the first optical layer is made of lenses with aspherical curvatures (corresponding to FIG. 1A)

FIG. 5 is identical to FIG. 1A and serves to illustrate the fact that all collecting elements 31 can be of the same type and joined into an array 30, in which each collecting elements 31 collects concentrated beams 50 coming from once corresponding lens in the optical arrangement 20. When solar cells are used, they can for example be of the heterojunctions, multi-junctions, GaAs, or c-Si type. Furthermore, they can have a typical diameter from 0.1 mm to 5 mm.

Figure 6:
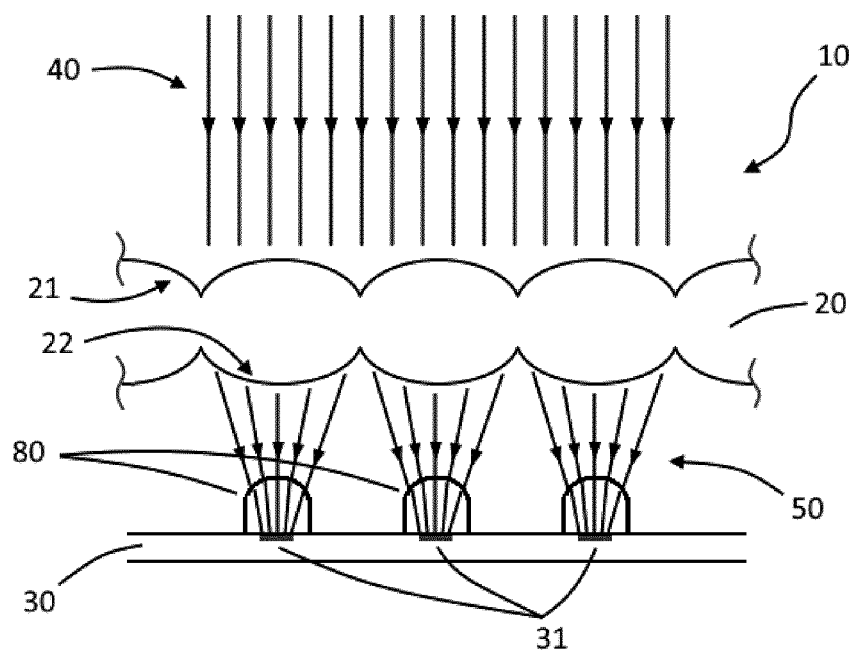
FIG. 6 is a schematic cross-sectional view of an optomechanical system; according to a fourth embodiment of the present invention the first optical layer is made of lenses with aspherical curvatures.

FIG. 6 illustrates an optomechanical system 10 according to a fourth embodiment of the present invention. The difference between the optomechanical system 10 according to the first embodiment of the invention and this optomechanical system 10 according to the fourth embodiment of the present invention is the use of first additional optical elements 80 in connection with each collecting element 31. These first additional optical elements 80 can in particular be used for improving the angular acceptance and/or for improving the homogeneity of distribution of the corresponding concentrated beam 50 of the incident light 40 and/or for increasing the concentration factor.

Figure 7:
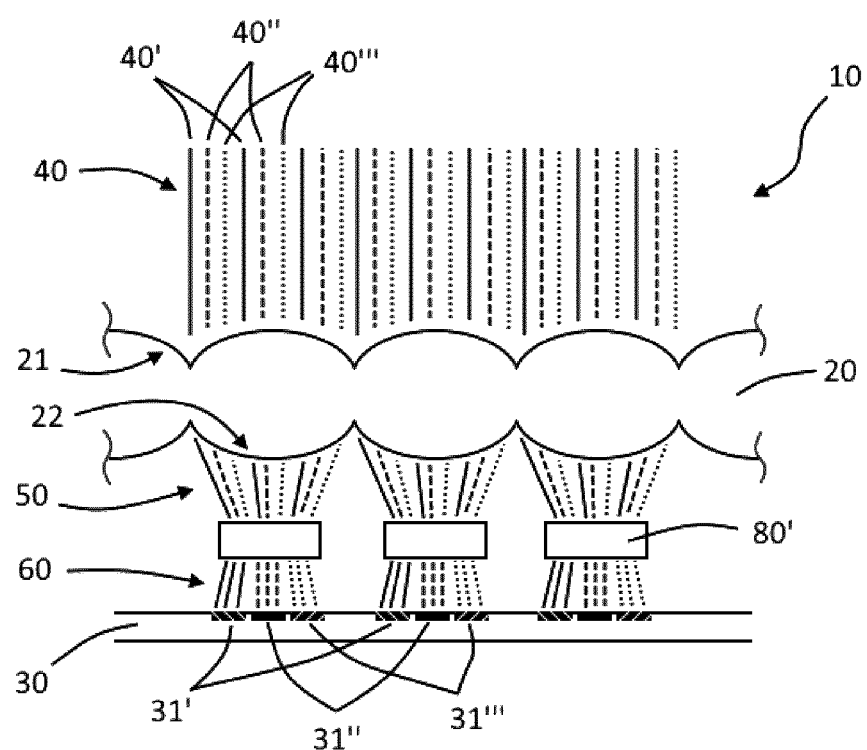
FIG. 7 is a schematic cross-sectional view of an optomechanical system; according to a fifth embodiment of the present invention the first optical layer is made of lenses with aspherical curvatures.

An optomechanical system 10 according to a fifth embodiment of the present invention is illustrated in FIG. 7. The particularity of the optomechanical system 10 according to this fifth embodiment of the present invention is the fact that this optomechanical system 10 comprises second additional optical elements 80' and three different types of collecting elements 31', 31", 31'". These second additional optical elements 80' are able to split the spectrum of the incident light 40 (which comprise light with different wavelength 40', 40", 40'") and then distribute the parts of the spectrum to the corresponding collecting elements 31', 31", 31'". This solution is particularly advantageous in case each of the different collecting elements 31', 31", 31'" has a particularly high efficiency in the given part of the light spectrum which they receive and collect.

Figure 8:
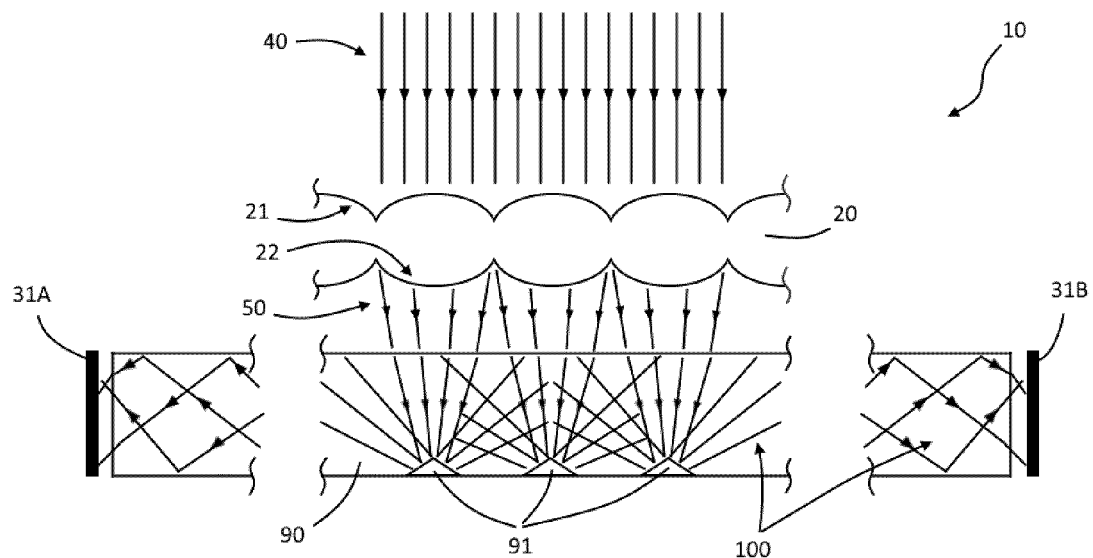
FIG. 8 is a schematic cross-sectional view of an optomechanical system; according to a sixth embodiment of the present invention, the first optical layer is made of lenses with aspherical curvatures.
Figure 9A:
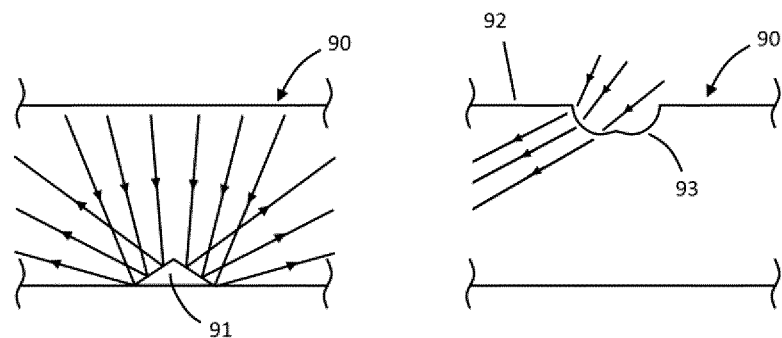
FIGS. 9A, 9B, 9C and 9D are schematic cross-sectional views of various variations of the optomechanical system according to the sixth sixth embodiment of the present invention.
Figure 9B:
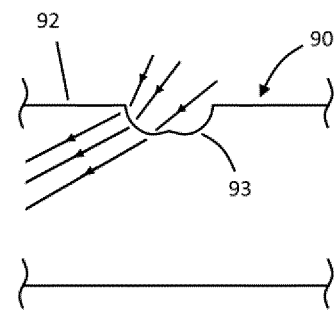
Figure 9C:
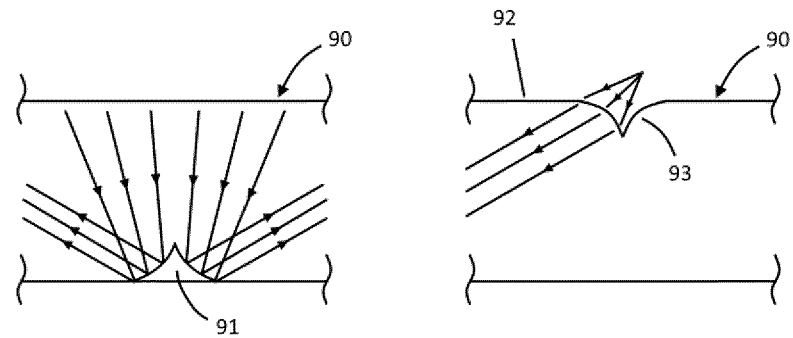
Figure 9D:
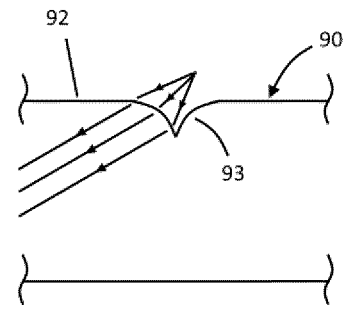
Figure 10A:
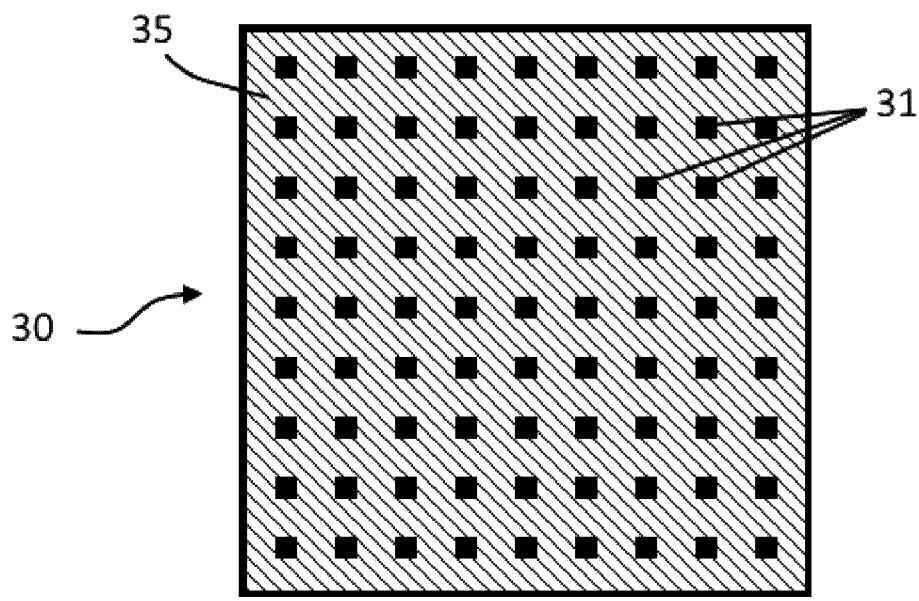
FIG. 10A is a schematic view from above and FIG. 10B a schematic cross-sectional view of a part of the optomechanical system according to a seventh embodiment of the present invention.
Figure 10B:
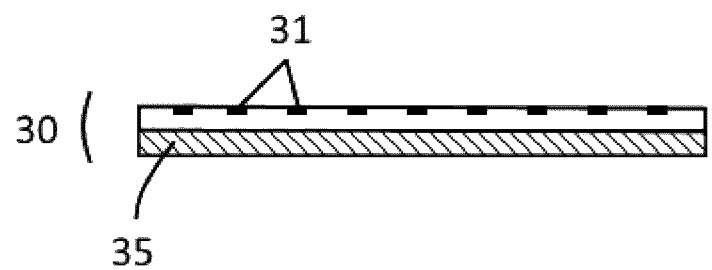
Figure 11A:
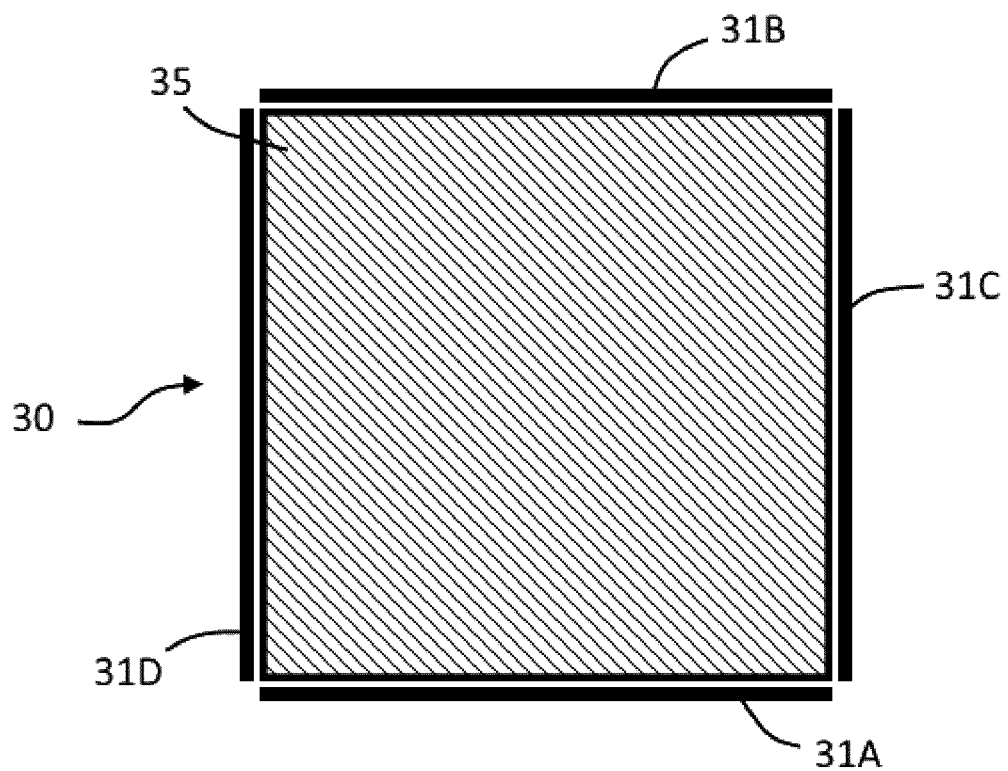
FIG. 11A is a schematic view from above and FIG. 11B a schematic cross-sectional view of a part of the optomechanical system according to the eighth embodiment of the present invention.
Figure 11B:
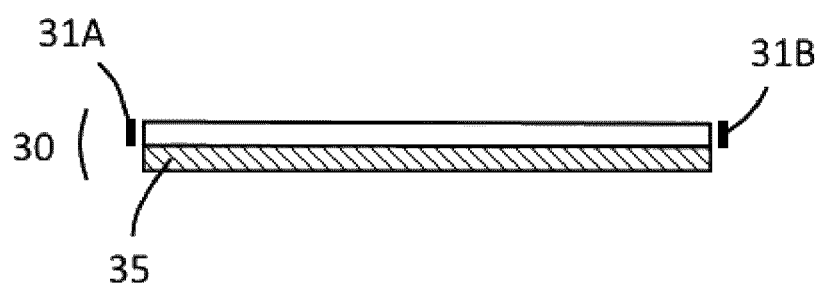

FIG. 8 illustrates an optomechanical system 10 according to a sixth embodiment of the present invention. With respect to the optomechanical systems 10 according to the previous embodiments of the present invention, the optomechanical system 10 according to this sixth embodiment of the present invention further comprises a waveguide 90 which receives concentrated beams 50 of the incident light 40 and guides them to the collecting elements 31A, 31B which are located at both extremities of the waveguide 90. Of course, it would also be possible to position the collecting elements 31A, 31B at a different position. To this end, the waveguide 90 comprises reflexion and direction elements 91 which can have different positions and shapes in function of the position of the collecting elements 31A, 31B and other constraints.

FIGS. 9A, 9B, 9C and 9D illustrate some of the options for the shape of the reflexion and direction elements 91 and some of the options for the shape of the upper surface of the waveguide 90. As can be seen, the upper surface 92 can comprise refractive recesses 93 with various shapes in order to achieve further concentration and/or collimation effects within the waveguide 90. Using a collimated beam has the advantage, among other things, that the light path is straight and therefore can easily be predicted with a high accuracy. It is therefore possible to design the system in which the light can avoid injection features, which are obstacles its propagation. In this way, light losses through outcoupling from the waveguide can be efficiently prevented.

Finally, the optomechanical system 10 of the seventh and eighth embodiments of the present invention can comprise additional (or "secondary") collecting elements 35 for collecting diffuse light, i.e. any light which has not been collected by the "primary" collecting elements 31. As illustrated in FIGS. 10A, 10B, 11A and 11B, these secondary collecting elements 35 can be located around the primary collecting elements 31 (i.e. surrounding them), or below the collecting elements 31 when seen in the direction of incidence of the incident light 40. When solar cells are used, these secondary solar cells can be for instance organic cells (Graetzel), perovskite, thin film or c-Si cells, while the primary cells are high efficiency cells, increasing thereby even more the overall energy collection efficiency of the system 10.

Figure 12A:
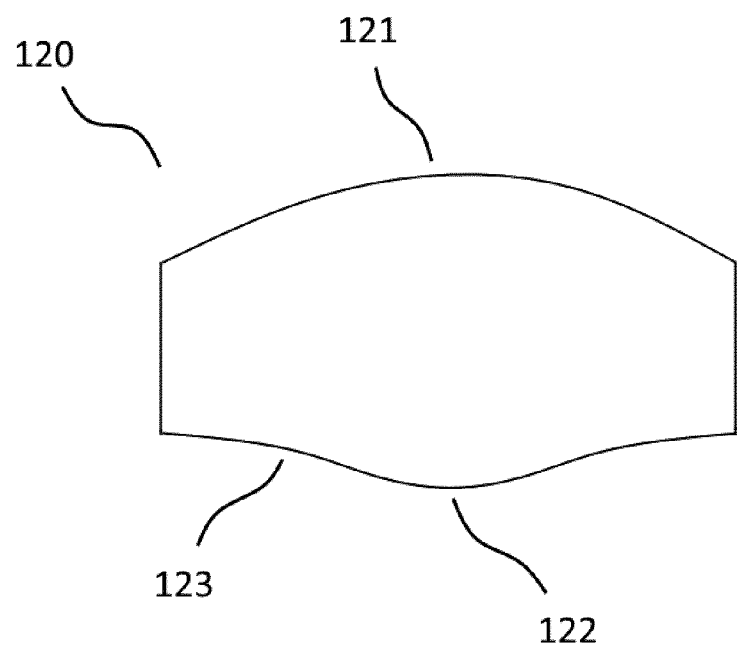
FIG. 12A is a schematic cross-sectional view of an aspherical lens according to the first embodiment of the present invention.

FIG. 12A illustrates a lens 120 where both the top and bottom surface have aspherical curvatures with multiple polynomial orders. The curvature of the top surface 121 is converging, while the curvature of the bottom surface has both a converging part 122 and a diverging part 123. This inflection between a converging and a diverging part is made possible by the high number of coefficients of the polynomial used to define the aspherical surface.

Figure 12B:
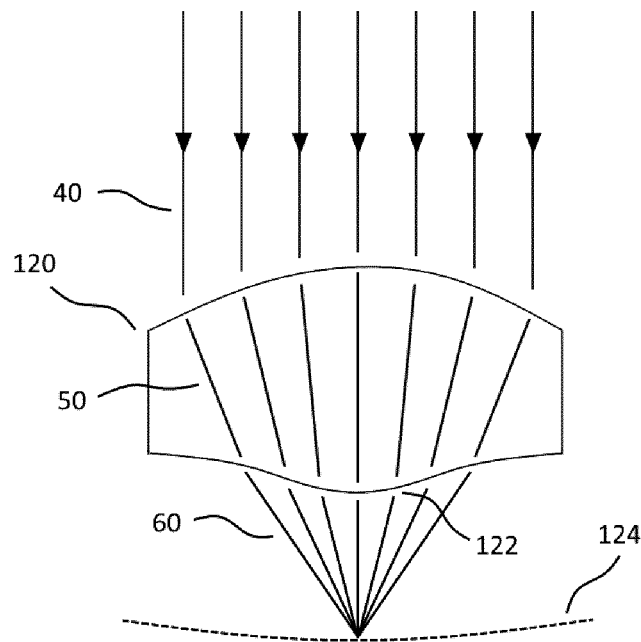
FIG. 12B is a schematic cross-sectional view of an aspherical lens with its Petzval curve according to the first embodiment of the present invention, with the incident light having a first direction.
Figure 12C:
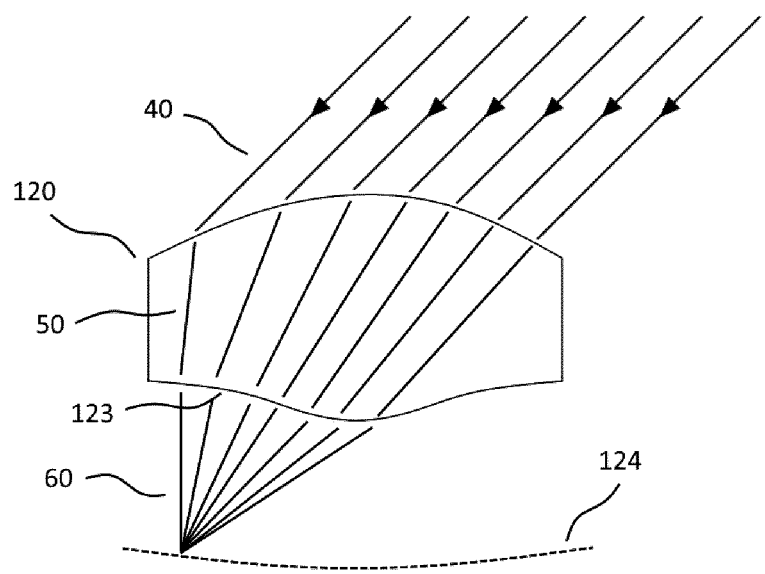
FIG. 12C is a schematic cross-sectional view of an aspherical lens with its Petzval curve according to the first embodiment of the present invention, with the incident light having a second direction.

FIGS. 12B and 12C illustrate an aspherical lens 120 with the incident beam of light 40 coming from two different directions. When the incident beam of light 40 is coming from a first direction (FIG. 12B), the intermediate beam 50 is directed towards the converging part 122 of the bottom surface, which increases the convergence of the intermediate beam 50 and decreases the distance at which the output beam 60 converges (i.e. decreases the focal length). When the incident beam of light 40 is coming from a second direction (FIG. 12C), the intermediate beam 50 is directed towards the diverging part 123 of the bottom surface, which decreases the convergence of the intermediate beam 50 and increases the distance at which the output beam 60 converges (i.e. increases the focal length). As illustrated by these two configurations, the specific design of the aspherical lens 120, achieved through the optimization of the polynomial defining its curvature, makes it possible to adjust the convergence of the output beam 60 depending on the direction of the incident light 40, so that the focal plane 124 of the lens is almost flat (the Petzval field curvature is minimized). Similarly, the polynomial curvature can be optimized to achieve any desired focal plane shape, such as a spherical focal plane.

Figure 13A:
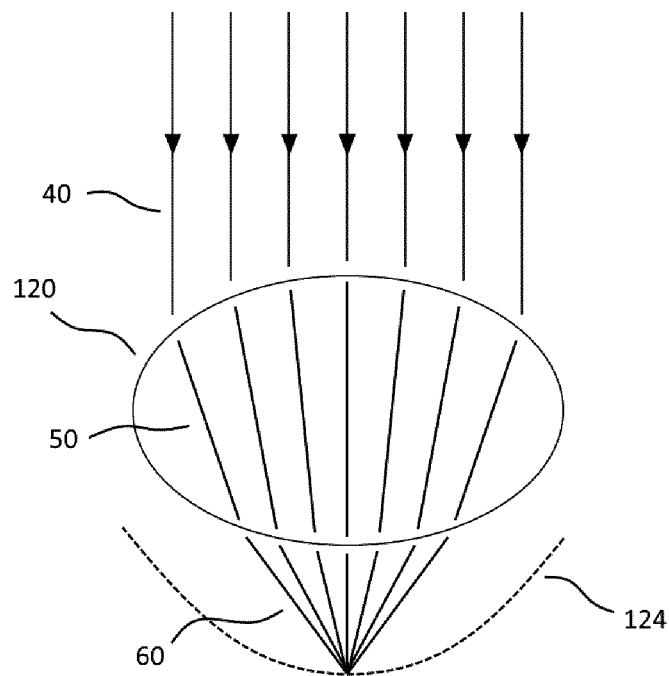
FIG. 13A is a schematic cross-sectional view of a spherical lens with its Petzval curve, not according to the present invention, with the incident light having a first direction.
Figure 13B:
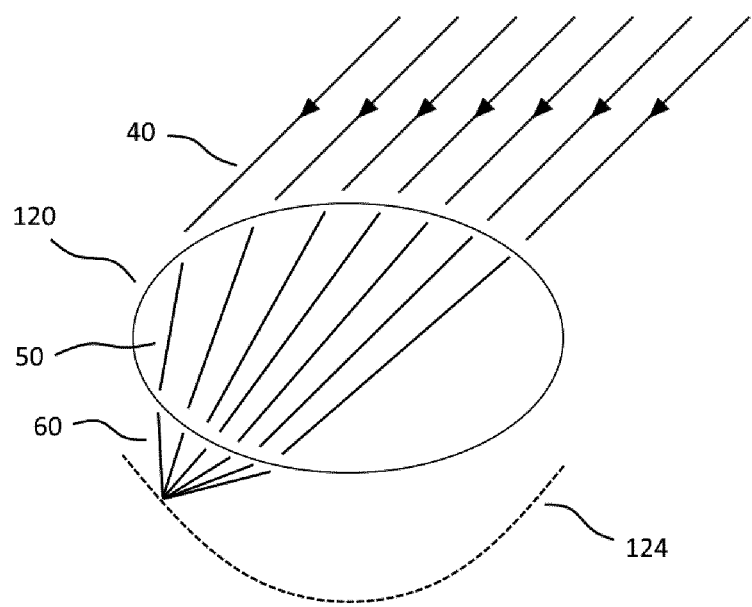
FIG. 13B is a schematic cross-sectional view of a spherical lens with its Petzval curve, not according to the present invention, with the incident light having a second direction.

FIG. 13A and FIG. 13B illustrate a spherical lens 120 with the incident beam of light 40 coming from two different directions. Because the lens surfaces are spherical, the focal plane 124 has a much stronger Petzval field curvature than with the aspherical lens design described in FIGS. 12A, 12B and 120.

Although the present disclosure has been described with reference to particular means, materials and embodiments, one skilled in the art can easily ascertain from the foregoing description the essential characteristics of the present disclosure, while various changes and modifications may be made to adapt the various uses and characteristics as set forth in the following claims.

In particular, the optomechanical system as described in the foregoing description can also be used in the opposite direction, thereby allowing for example for an optimised lightning system. More specifically, if a light source is used instead of a collecting element 31, 31', 31", 31'", 31A, 31B, the optical arrangement 20 can easily be used in order to adjust the direction of irradiation of this light. To this end, the optical arrangement 20 needs to be moved with respect to the light source by means of the shifting mechanism until the required direction of irradiation has been achieved. All different embodiments of the invention (with a single optical layer in the optical arrangement 20, with two optical layers in the optical arrangement 20, with a waveguide 90) can be used in a way analogous to the use of the optomechanical system 10 for collecting the incident light 40, as explained beforehand. A skilled person will of course also understand that, if the optomechanical system 10 is used in this way, additional elements (e.g. for changing the wavelength of the light, etc.) can equally be deployed.

The invention claimed is:

1. An optomechanical system for capturing and transmitting incident light with a variable direction of incidence to solar cells, comprising:
    an optical arrangement configured to capture a beam of the incident light, to concentrate the captured beam of the incident light, and to transmit one or more concentrated beams of the incident light to the solar cells,
    the optical arrangement comprises a first optical layer comprising a plurality of optical lenses, each of said plurality of optical lenses having an aspheric curvature and comprising a first surface and an opposite second surface, the first surface capturing the beam of the incident light, the second surface transmitting said one or more concentrated beams of the incident light, each said second surface having a polynomial curvature with multiple orders, wherein the polynomial curvature with multiple orders comprises a converging part and a diverging part with an inflection point disposed therebetween,
    the solar cells arranged in a two-dimensional array, and said optical arrangement being movable with respect to the solar cells along at least two perpendicular axes to provide optimal collection of the one or more concentrated incident light beams from any direction of incidence of the incident light by the solar cells,
    wherein each of the one or more concentrated beams of the incident light is collected by the one solar cell located at the focal point of the corresponding optical lens of the optical arrangement, and wherein the incident light is sunlight.

2. The optomechanical system of claim 1, wherein each of said plurality of optical lenses has a polynomial curvature of third order or higher.

3. The optomechanical system of claim 1, wherein the optomechanical system further comprises at least one secondary collecting element for collecting diffuse light or any light otherwise not collected by the solar cells.

4. The optomechanical system of claim 2, wherein the aspherical curvature of the first optical layer of the optical arrangement is chosen such that the field curvature of the optical arrangement is minimized.

5. The optomechanical system of claim 2, wherein aspherical curvature of the first optical layer of the optical arrangement is chosen such that a spherical field curvature is achieved.

6. The optomechanical system of claim 1, wherein the optical arrangement further comprises a second optical layer, the first optical layer and the second optical layer being movable one with respect to the other.

7. The optomechanical system of claim 6, wherein a diameter of a contour of optical lenses in the second optical layer is equal or smaller than a diameter of a contour of the optical lenses in the first optical layer.

8. The optomechanical system of claim 1, wherein the optical lenses are made of glass, PMMA, silicone, silicone bonded on glass or PC.

9. The optomechanical system of claim 1, wherein each of the solar cells comprises a first additional optical element for improving the angular acceptance and/or improving the homogeneity of distribution of the corresponding concentrated beam of the incident light and/or increasing the concentration factor.

10. The optomechanical system of claim 1, wherein the optomechanical system comprises at least one second additional optical element for splitting the at least one concentrated beam of the incident light into beams of light with different wavelengths, each of the individual beams of light with different wavelengths being collected by a separate collecting element.

11. The optomechanical system of claim 1, wherein said optical arrangement utilizes mechanical deformation to produce movement of optical arrangement with respect to the solar cells.

12. The optomechanical system of claim 11, wherein the optical arrangement further comprises elastic springs and/or blades or leaf springs configured to move said optical arrangement with respect to the solar cells.

13. An optomechanical system for capturing and transmitting incident light with a variable direction of incidence to solar cells comprising:
    an optical arrangement configured to capture a beam of the incident light, to concentrate the captured beam of the incident light, and to transmit one or more concentrated beams of the incident light to the solar cells, the optical arrangement comprises a first optical layer comprising a plurality of optical lenses, each of said plurality of optical lenses having an aspheric curvature and comprising a first surface and an opposite second surface, the first surface capturing the beam of the incident light, the second surface transmitting said one or more concentrated beams of the incident light, each said second surface having a polynomial curvature with multiple orders, wherein the polynomial curvature with multiple orders comprises a converging part and a diverging part with an inflection point disposed therebetween, the solar cells arranged in a two-dimensional array, the optical arrangement being movable with respect to the solar cells along at least two perpendicular axes to provide optimal collection of the one or more concentrated incident light beams from any direction of incidence of the incident light by the solar cells, and at least one secondary collecting element for collecting diffuse light or any light otherwise not collected by the solar cells, wherein each of the one or more concentrated beams of the incident light is collected by the one solar cell located at the focal point of the corresponding optical lens of the optical arrangement, and wherein the incident light is sunlight.

14. The optomechanical system of claim 13, wherein each of said plurality of optical lenses has a polynomial curvature of third order or higher.

15. The optomechanical system of claim 14, wherein the aspherical curvature of the first optical layer of the optical arrangement is chosen such that the field curvature of the optical arrangement is minimized.

16. The optomechanical system of claim 14, wherein the aspherical curvature of the first optical layer of the optical arrangement is chosen such that a spherical field curvature is achieved.

17. The optomechanical system of claim 13, wherein the optical arrangement further comprises a second optical layer, the first optical layer and the second optical layer being movable one with respect to the other.

18. The optomechanical system of claim 17, wherein a diameter of a contour of optical lenses in the second optical layer is equal or smaller than a diameter of a contour of the optical lenses in the first optical layer.

19. The optomechanical system of claim 13, wherein the optical lenses are made of glass, PMMA, silicone, silicone bonded on glass or PC.

20. The optomechanical system of claim 13, wherein each one of the solar cells comprises a first additional optical element which improves the angular acceptance and/or improves the homogeneity of distribution of the corresponding concentrated beam of the incident light and/or increasing the concentration factor.

21. The optomechanical system of claim 13, wherein the optomechanical system comprises at least one second additional optical element for splitting the at least one concentrated beam of the incident light into beams of light with different wavelengths, each of the individual beams of light with different wavelengths being collected by a separate collecting element.

22. The optomechanical system of claim 13, wherein said optical arrangement utilizes mechanical deformation to produce movement of optical arrangement with respect to the solar cells.

23. The optomechanical system of claim 22, wherein the optical arrangement further comprises elastic springs and/or blades or leaf springs configured to move said optical arrangement with respect to the solar cells.

24. A method for capturing and transmitting incident light with a variable direction of incidence to solar cells arranged in a two-dimensional array, comprising:

capturing a beam of the incident light by an optical arrangement, the optical arrangement comprises a first optical layer comprising a plurality of optical lenses, concentrating the captured beam of the incident light, transmitting one or more concentrated beams of the incident light to the solar cells, and moving the optical arrangement with respect to the solar cells along at least two perpendicular axes such that, for any direction of incidence of the incident light, the one or more concentrated beams of the incident light can be optimally collected by the one solar cell located at the focal point of the corresponding optical lens of the optical arrangement, wherein the incident light is sunlight, each of said plurality of optical lenses having an aspheric curvature and comprising a first surface and an opposite second surface, the first surface capturing the beam of the incident light, the second surface transmitting said one or more concentrated beams of the incident light, each said second surface having a polynomial curvature with multiple orders, wherein the polynomial curvature with multiple orders comprises a converging part and a diverging part with an inflection point disposed therebetween.

25. A method for capturing and transmitting incident light with a variable direction of incidence to solar cells, arranged in a two-dimensional array, comprising:

capturing a beam of the incident light by an optical arrangement, the optical arrangement comprises a first optical layer comprising a plurality of optical lenses, concentrating the captured beam of the incident light, transmitting one or more concentrated beams of the incident light to the solar cells, moving the optical arrangement with respect to the solar cells along at least two perpendicular axes such that, for any direction of incidence of the incident light, the one or more concentrated beams of the incident light can be optimally collected by the one solar cell located at the focal point of the corresponding optical lens of the optical arrangement, and using at least one secondary collecting element to collect diffuse light or any light otherwise not collected by the solar cells, wherein the incident light is sunlight, each of said plurality of optical lenses having an aspheric curvature and comprising a first surface and an opposite second surface, the first surface capturing the beam of the incident light, the second surface transmitting said one or more concentrated beams of the incident light, each said second surface having a polynomial curvature with multiple orders, wherein the polynomial curvature with multiple orders comprises a converging part and a diverging part with an inflection point disposed therebetween.

* * * * *